United States Patent [19]

Mogi et al.

[11] 4,430,581

[45] Feb. 7, 1984

[54] SEMICONDUCTOR SUBSTRATE BIAS CIRCUIT

[75] Inventors: Jun-ichi Mogi, Kawasaki; Kiyoshi Miyasaka; Seiji Enomoto, both of Yokohama; Shigeki Nozaki, Kawasaki, all of Japan

[73] Assignee: Fujitsu Limited, Kawasaki, Japan

[21] Appl. No.: 263,279

[22] Filed: May 13, 1981

Related U.S. Application Data

[63] Continuation-in-part of Ser. No. 197,774, filed as PCT/JP79/00274, Oct. 29, 1979, published as WO80/01021, May 15, 1980, § 102(e)/abandoned.

[30] Foreign Application Priority Data

Oct. 30, 1978 [JP] Japan ............................... 53-133384

[51] Int. Cl.[3] ........................ H03K 3/01; H03K 3/353

[52] U.S. Cl. ................................ 307/296 R; 307/297; 307/304

[58] Field of Search ........................ 307/296, 297, 304

[56] References Cited

U.S. PATENT DOCUMENTS

| | | | |
|---|---|---|---|
| 3,806,741 | 4/1974 | Smith | 307/304 |
| 4,142,114 | 2/1979 | Green | 307/297 |
| 4,229,667 | 10/1980 | Heimbigner et al. | 307/304 |
| 4,266,151 | 5/1981 | Hoffman et al. | 307/297 |
| 4,356,412 | 10/1982 | Moench et al. | 307/304 |

FOREIGN PATENT DOCUMENTS

| | | |
|---|---|---|
| 5024054 | 3/1917 | Japan . |
| 53-82252 | 7/1978 | Japan . |
| 53-102682 | 9/1978 | Japan . |

*Primary Examiner*—Stanley D. Miller
*Assistant Examiner*—B. P. Davis
*Attorney, Agent, or Firm*—Staas & Halsey

[57] ABSTRACT

A semiconductor circuit consisting of a dynamic-type circuit and a bias-voltage generating circuit. The bias-voltage generating circuit is comprised of a first bias-voltage generator and a second bias-voltage generator. The first generator absorbs a variable substrate current, the magnitude of which is proportional to the operating frequency of the dynamic-type circuit, while the second generator absorbs a substrate current, the magnitude of which is not proportional to the operating frequency of the dynamic-type circuit. Alternately, both portions of the substrate current may be absorbed via the same circuitry.

15 Claims, 8 Drawing Figures

SEMICONDUCTOR SUBSTRATE BIAS CIRCUIT

CROSS-REFERENCE TO RELATED APPLICATIONS

This application is a continuation-in-part of application Ser. No. 197,774, filed as PCT/JP79/00274, Oct. 29, 1979, published as WO 80/01021, May 15, 1980 filed June 25, 1980, abandoned which resulted from an International Application designating the United States Ser. No. PCT/JP79/00274, filed Oct. 29, 1979.

BACKGROUND OF THE INVENTION

The present invention relates generally to a semiconductor circuit, and more particularly to an MOS integrated circuit including a bias-voltage generator mounted on the substrate thereof, with the bias voltage being applied to this substrate.

Generally, an MOS integrated circuit is provided with a bias-voltage generator so as to establish and maintain the desired optimum circuit operation of each of the semiconductor devices, such as FETs (Field Effect Transistors), which constitute the MOS integrated circuit. For instance, if the threshold voltage is below a specified or nominal level, the semiconductor device is unstable in operation, as it may be improperly rendered conductive by a noise signal, and is thus particularly unsuitable for use in logic circuits. Contrary to the above, if the threshold voltage is greater than the desired level, the speed of the operation of the semiconductor device is reduced, and the semiconductor device may fail to be turned on when an input signal is applied to the control electrode. Thus, the level of the threshold voltage must be maintained at a desired optimum level. The maintenance of the level of the threshold voltage at a desired optimum level is achieved by a bias-voltage generator which functions to absorb the so-called substrate current ($I_{BB}$) which flows across the substrate.

In view of the operation thereof, MOS integrated circuits are generally classified into two types of circuits: first, a static-type circuit; and second, a dynamic-type circuit. In the static-type circuit, for example a static-type storage device, there is no limit with respect to the operating frequency. This is because such a static-type storage device operates based not on the stray capacitors accommodated therein, but on a static current supplied from a power supply. In contrast there is a lower limit with respect to the operating frequency of dynamic-type circuits, for example dynamic-type storage devices. This is because such a dynamic-type storage device is operated by using electric charges stored in stray capacitors, which electric charges are discharged therefrom with some RC time constant. Generally, in the former static-type circuit, since this circuit is operated by using said static current, the magnitude of said substrate current does not vary and is held at a constant level. In the latter dynamic-type circuit, however, since this circuit is operated by using said electric charges stored in stray capacitors, the magnitude of the substrate current ($I_{BB}$) varies in proportion to the operating frequency thereof. That is, when the operating frequency becomes low, the magnitude of the current ($I_{BB}$) is low. Contrary to this, when the operating frequency becomes high, the magnitude of the current ($I_{BB}$) is high. Thus, since the operating frequency usually varies within a wide range of frequencies, the bias-voltage generator must be designed so as to have a capability for absorbing the substrate current ($I_{BB}$) having a maximum allowed magnitude level, which current ($I_{BB}$) will flow when the circuit operates with the highest operating frequency. Therefore, such a bias-voltage generator always consumes relatively high power, even when the circuit operates at a relatively low operating frequency. This fact is the shortcoming of a typical bias-voltage generator.

For the purpose of overcoming the above mentioned shortcoming, an improved bias-voltage generator has been proposed in, for example, U.S. Pat. No. 3,806,741, entitled SELF-BIASING TECHNIQUE FOR MOS SUBSTRATE VOLTAGE, by Frederick J. Smith. In the improved bias-voltage generator, this bias-voltage generator can absorb the substrate current ($I_{BB}$) in such a manner that the magnitude thereof varies in accordance with the variation of the operating frequency of the dynamic-type circuit. In other words, the magnitude of the current ($I_{BB}$) always matches the operating frequency, thereby the aforesaid shortcoming of the typical bias-voltage generator can be overcome.

However, the improved bias-voltage generator has a disadvantage in that this bias-voltage generator cannot absorb the full substrate current ($I_{BB}$) when the dynamic-type circuit operates at a very low operating frequency, due to the presence of the so-called junction leak current, the magnitude thereof not being proportional to the variation of the operating frequency. In other words, since the bias-voltage generator functions to absorb merely the substrate current ($I_{BB}$) having a very low magnitude at a time when the operating frequency is relatively low, this bias-voltage generator cannot absorb the junction leak current, because the magnitude of the substrate leak current is higher than the magnitude of the substrate current ($I_{BB}$) to be absorbed by this bias-voltage generator.

SUMMARY OF THE INVENTION

An object of the present invention is, therefore, to provide a semiconductor system provided with a dynamic-type circuit and a bias-voltage generator, which bias-voltage generator does not create the aforementioned disadvantage of the prior improved bias-voltage generator.

According to the present invention, there is provided a first bias-voltage generator and a second bias-voltage generator, the former generator absorbing a first part of the substrate current, the magnitude of which is proportional to the operating frequency of the dynamic-type circuit, and the latter generator absorbing a second part of the substrate current, the magnitude of which is not proportional to the operating frequency of the dynamic-type circuit. Moreover, in order to conserve chip "real estate," circuitry for absorbing both the frequency-dependent and leakage components of the substrate current may employ circuitry in common.

DESCRIPTION OF THE PREFERRED EMBODIMENTS

Figure 1:
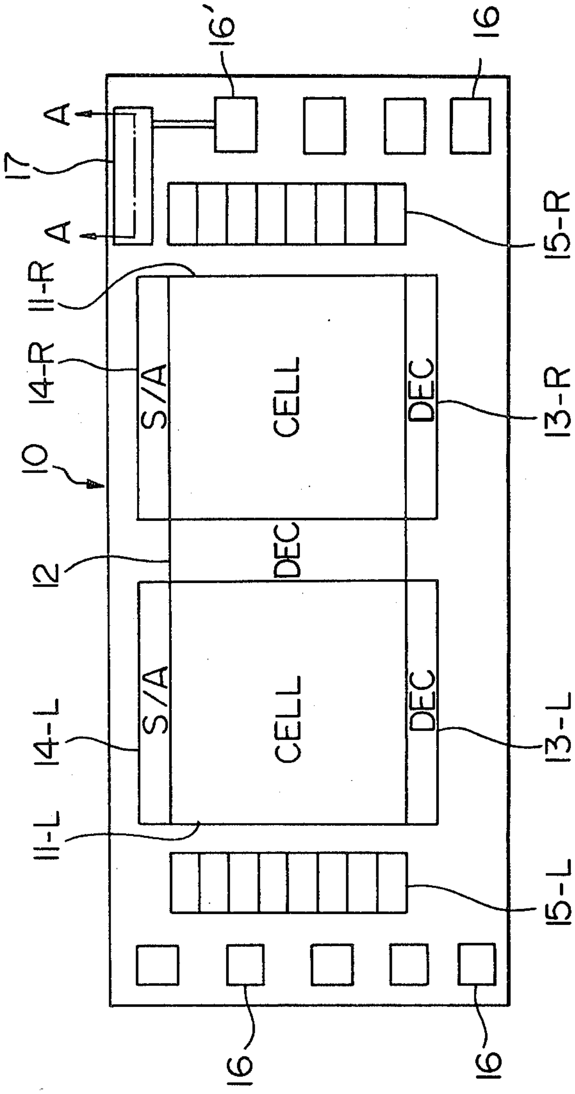
FIG. 1 is a plan view of an example of a typical semiconductor device.

In FIG. 1, which is a plan view of an example of a typical semiconductor system, a dynamic-type storage device is illustrated as an example of the dynamic-type circuit. The storage device is comprised of left memory cell area 11-L, right memory cell area 11-R, a word decoder 12, a left column decoder 13-L, a right column decoder 13-R, a left sense amplifier 14-L, and a right sense amplifier 14-R. The storage device further cooperates with both a left periphery circuit 15-L and a right periphery circuit 15-R. Many input/output pads 16 (16') are mounted on a substrate 10 at both sides thereof. Each function of the above members is already well known by persons skilled in the art. The reference numeral 17 represents a bias-voltage generator to which the present invention is specifically directed.

Figure 2:
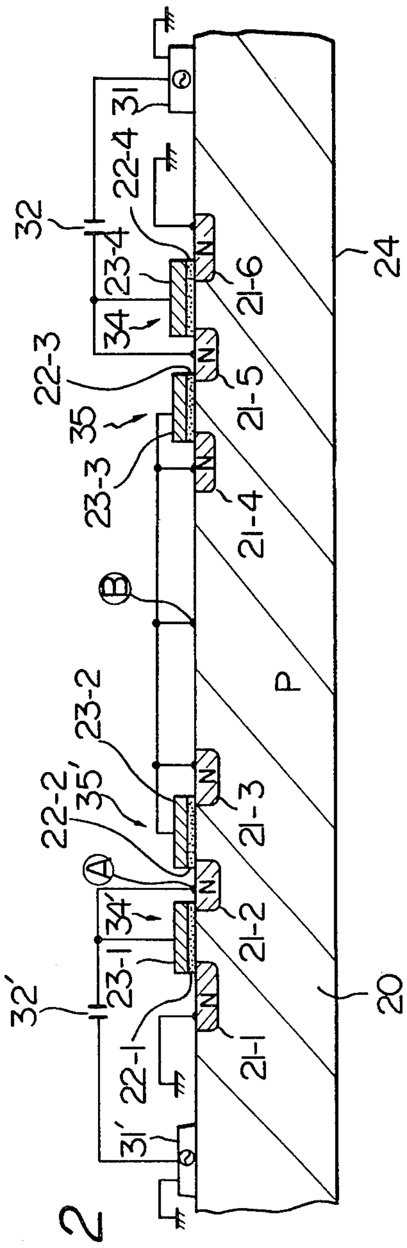
FIG. 2 is a schematic cross-sectional view of a bias-voltage generator, according to the present invention, taken along the line A—A shown in FIG. 1.
Figure 3:
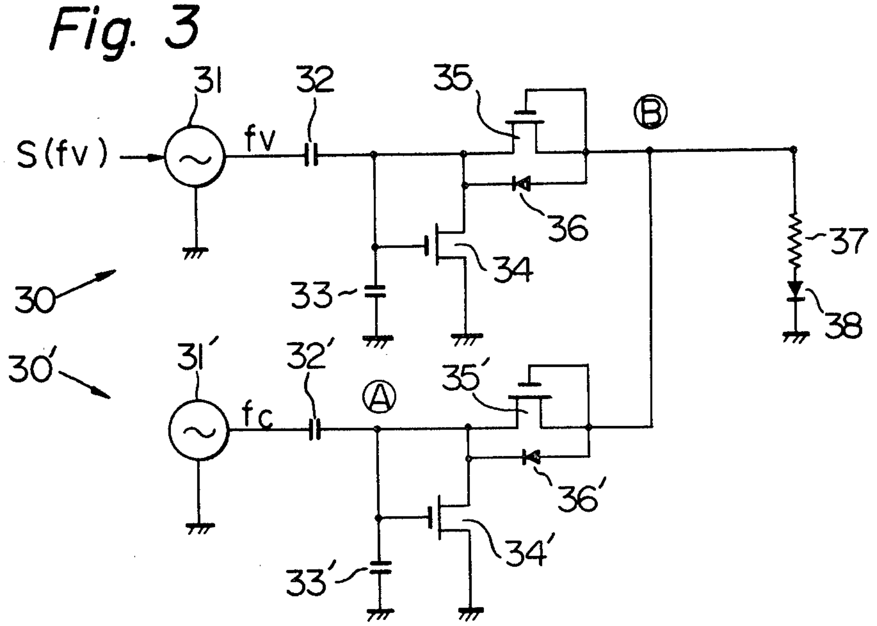
FIG. 3 illustrates an equivalent circuit diagram for devices as shown in FIG. 2.

The bias-voltage generator 17, according to the present invention, is illustrated in FIG. 2, which is a schematic cross-sectional view taken along the line A—A shown in FIG. 1. The equivalent circuit diagram for the devices shown in FIG. 2 is illustrated in FIG. 3. In both FIGS. 2 and 3, the members represented by the same reference numerals or symbols are identical with each other. The reference numeral 20 indicates a P-type substrate. A plurality of N-type regions 21-1 through 21-6 are formed in the P-type substrate 20. On the substrate 20, gate electrodes 23-1 through 23-4 are formed, respectively, on gate insulators 22-1 through 22-4. Therefore, an FET 34' (also shown in FIG. 3) is composed of the N-region 21-1 (source), the N-region 21-2 (drain), the insulator 22-1 and the electrode 23-1. An FET 35' (also shown in FIG. 3) is composed of the N-region 21-2 (drain), which is common to the FET 34', the N-region 21-3 (source), the insulator 22-2 and the electrode 23-2. In a similar manner, FETs 34 and 35 are composed of the corresponding members 21-4 through 21-6, 22-3, 22-4, 23-3 and 23-4. The reference numeral 31 represents an oscillator which produces a pulse train having a frequency proportional to the operating frequency of the dynamic-type circuit, such as the storage device shown in FIG. 1. The reference numeral 31' represents an oscillator which produces a pulse train having a predetermined constant frequency. The word "constant" denotes that the oscillating frequency is not proportional to the operating frequency. The reference numerals 32 and 32' represent capacitors, respectively (shown in both FIGS. 2 and 3). The reference numerals 33 and 33' represent stray capacitors (not specifically shown in FIG. 2). The stray capacitors 33 and 33' are formed at, for example, each junction of the N-type regions and the P-type substrate shown in FIG. 2. The reference numerals 36 and 36' represent quasi diodes (not specifically shown in FIG. 2). The diodes 36 and 36' are inevitable created, respectively, at the respective junctions of the N-type regions and P-type substrate defining the FETs 35 and 35' shown in FIG. 2. The reference numeral 37 of FIG. 3 represents a quasi bulk resistor existing across the substrate 20 between a conductive stage 24 and the N-type region 21-1 and also between the conductive stage 24 and the N-type region 21-6 shown in FIG. 2. The reference numeral 38 of FIG. 3 represents a quasi diode existing between the N-type region 21-1 and the P-type substrate 20 and also between the N-type region 21-6 and the P-type substrate 20.

Figure 4:
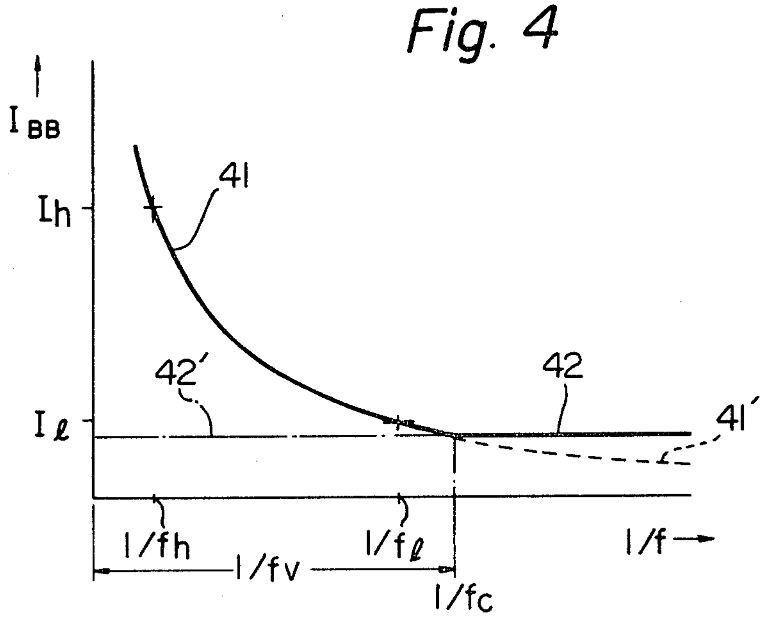
FIG. 4 is a graph representing the relationship between a substrate current ($I_{BB}$) and the reciprocal value of the operating frequency (1/f)

The operational principle of the bias-voltage generator according to the present invention will be clarified with reference to FIG. 4. In FIG. 4, which is a graph representing a relationship between the substrate current ($I_{BB}$) and the reciprocal value of the operating frequency (1/f), the abscissa indicates the reciprocal value of the operating frequency (1/f) and the ordinate indicates the value of the substrate current ($I_{BB}$). As previously mentioned, in the prior improved bias-voltage generator, the magnitude of the substrate current ($I_{BB}$) varies in accordance with the variation of the operating frequency (f) of the dynamic-type circuit. Consequently, the substrate current ($I_{BB}$) to be absorbed by such a bias-voltage generator varies along a curve (41, 41') with respect to the variation of (1/f). However, such a bias-voltage generator does not take into account the presence of the aforesaid junction leak current. The magnitude of this junction leak current is non-changeable with respect to the variation of the operating frequency (f), as is represented by a straight line (42, 42'). The junction leak current flows across each junction of the N-type regions 21-1 through 21-6 and the P-type substrate 20 (see FIG. 2). As a result, the prior improved bias-voltage generator cannot absorb the substrate current ($I_{BB}$) which corresponds to the difference in value between the current (42) and the current (41'). Consequently, the voltage potential of the substrate will deviate from the desired optimum voltage potential due to the accumulation of the substrate current which has not been absorbed by the bias-voltage generator. Accordingly, the threshold voltage cannot be maintained at the desired optimum level.

For the purpose of eliminating the aforementioned disadvantage of the prior improved bias-voltage generator, the bias-voltage generator of the present invention functions to absorb the substrate current ($I_{BB}$) along the curve 41 and the line 42. That is, when the dynamic-type circuit works with the operating frequency ($f_v$) which is higher than a critical operating frequency ($f_c$), the bias-voltage generator absorbs the substrate current (41), the magnitude of which varies in accordance with the variation of the operating frequency ($f_v$). Contrary to this, when the dynamic-type circuit works with the operating frequency which is lower than the critical operating frequency ($f_c$), the bias-voltage generator absorbs the substrate current (42) which corresponds to the junction leak current. As a result, the bias-voltage generator of the present invention can always absorb the optimum value of the substrate current ($I_{BB}$), so that the voltage potential of the substrate does not deviate from the desired optimum potential.

Returning to FIG. 3, the bias-voltage generator of the present invention is divided into two parts: first a variable bias-voltage generator 30; and a constant bias-voltage generator 30'. The former generator 30 is comprised of the aforesaid members 31 through 36 and the latter generator 30' is comprised of the aforesaid members 31' through 36'. The generator 30 functions to absorb the variable substrate current ($I_{BB}$) (corresponding to the curve (41) shown in FIG. 4) and the generator 30′ functions to absorb the constant substrate current ($I_{BB}$) (corresponding to the line (42) shown in FIG. 4). In order to perform the function for obtaining the curve (41), the generator 30 includes the variable oscillator 31 which receives a control signal $S(f_v)$ and produces an output pulse train having a frequency $f_v$ proportional to the frequency of the signal $S(f_v)$. This frequency $f_v$ is equal to or proportional to the operating frequency of the dynamic-type circuit, such as the storage device shown in FIG. 1. Contrary to the above, in order to perform the function for obtaining the line (42), the generator 30′ includes the constant oscillator 31′ which produces an output pulse train having the constant frequency $f_c$.

Figure 5:
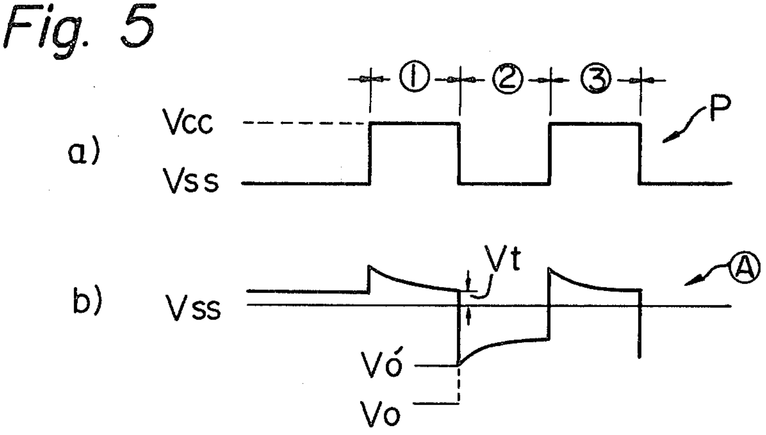
FIG. 5 depicts waveforms of signals developed at major portions in the circuit shown in FIG. 3.

The operation of each of the bias-voltage generators is as follows. It should be noted that the generators 30 and 30′ have the same circuit construction, and therefore, the following explanation of the operation is effected with regard only to the generator 30′ with reference to FIG. 5. FIG. 5 depicts waveforms of signals developed at major portions in the circuit of FIG. 3. The waveform of the output signal from the oscillator 30′ is illustrated on line "(a)" of FIG. 5. This output signal P has the constant frequency $f_c$. In period ①, the voltage level of the output signal P changes from a voltage $V_{ss}$ to a voltage $V_{cc}$. The voltage $V_{ss}$ is the same as the voltage developed at the external ground point represented by the ground symbols shown in FIGS. 2 and 3. At the rising edge of the signal P in the period ①, the voltage level at a portion Ⓐ (shown in FIGS. 2 and 3) rises quickly due to the presence of the capacitor 32′ (see line "(b)" of FIG. 5). Thereafter, the voltage level at the portion Ⓐ gradually decreases to a threshold voltage level $V_t$. This is because, since the voltage level at portion Ⓐ exceeds the threshold voltage level $V_t$, the FET 34′ is caused to be conductive and the charges stored at the capacitor 32′ are discharged to the ground ($V_{ss}$) via the FET 34′ which is now conductive. Next, on line "(b)" of FIG. 5, at the falling edge of the signal P in the period ①, the voltage level at the portion Ⓐ quickly falls down toward a voltage level $V_o$ which is equal to $$\left(V_t - V_{cc}\cdot\frac{C_{32'}}{C_{32'} + C_{33'}}\right),$$

where the symbols $C_{32'}$ and $C_{33'}$ denote the capacitance values of the capacitors 32′ and 33′, respectively.

In this case, the quasi diode 36′ becomes conductive and the substrate current ($I_{BB}$) flows from the substrate at a portion Ⓑ (see FIGS. 2 and 3) to the capacitor 32′ and the stray capacitor 33′, via the diode 36′. Since the diode 36′ has its own threshold voltage, for example 0.6 V, it is preferable to form a bypassing root of the diode 36′. In FIGS. 2 and 3, the bypassing root is comprised of the FET 35′ which has a threshold voltage of about 0 V. Thus, a so-called diode clamp is performed during period ②. It should be understood that the portion Ⓑ may further be connected to the conductive stage 24 shown in FIG. 2. In this period ② the charges that constitute the substrate current ($I_{BB}$) are absorbed from the substrate at the portion Ⓑ, toward the capacitors 32′ and 33′, the amount of charge Q being expressed by the equation, $$Q = (C_{32'} + C_{33'}) \times \left[\left(\frac{C_{32'}}{C_{32'} + C_{33'}}\cdot V_{cc} - V_t\right) - V_{BB}\right],$$

where the symbol $V_{BB}$ denotes the substrate biasing voltage. At the rising edge of the signal P in a period ③ (see FIG. 5), the voltage level at the portion Ⓐ quickly rises again. At the same time, the FET 34′ becomes conductive again and said charge Q is discharged to the external ground point ($V_{ss}$) via the FET 34′. Thus, the charge Q, which produces the substrate current ($I_{BB}$), is pumped out from the substrate by means of the bias-voltage generator 30′ every time the rising edge of the output signal P appears. Since the output signal P has the constant frequency $f_c$ subject to the constant oscillator 31′, the constant substrate current ($I_{BB}$) (see the line (42) in FIG. 4) is absorbed by the generator 30′.

Regarding the bias-voltage generator 30 of FIG. 3, since the generator 30 is driven by the variable oscillator 31 which oscillates in proportion to the operating frequency $f_v$ of the dynamic-type circuit, when the dynamic-type circuit works at a relatively high operating frequency, for example $f_h$ shown in FIG. 4, the magnitude of the substrate current ($I_{BB}$) becomes relatively high, such as a level $I_h$ shown in FIG. 4. This occurs because the number of the aforesaid pumping out operations is relatively large and a relatively large amount of charge Q is absorbed. If the dynamic-type circuit works at a relatively low operating frequency, for example $f_l$ shown in FIG. 4, the magnitude of the substrate current ($I_{BB}$) becomes relatively low such as a level $I_l$ shown in the same FIG. 4, because the number of the pumping out operations is relatively small and a relatively small amount of the charges Q are absorbed.

Figure 8:
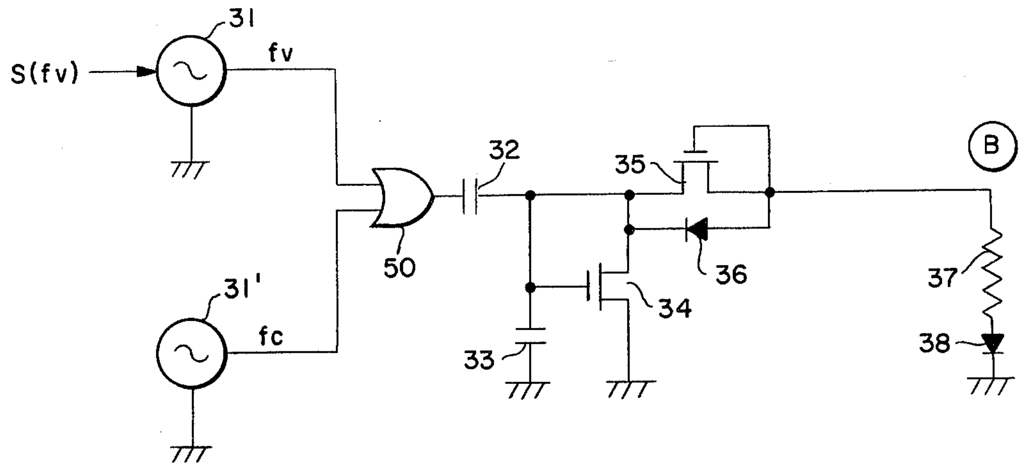
FIG. 8 illustrates the equivalent circuit diagram of an embodiment wherein circuitry is used in common for absorbing both the frequency-dependent and leakage components of the substrate current.

From the foregoing descriptions it will be apparent that the circuit of FIG. 3 provides a constant bias-voltage generator 30′ for absorbing the leakage component of the substrate current $I_{BB}$ and a similar variable vias-voltage generator 30 for simultaneously but independently absorbing the frequency-dependent component of the substrate current. The independence of these generators in the FIG. 3 embodiment may be undesirable when chip "real estate" is at a premium, as it frequently is in MOS integrated circuits, since some of the circuit elements (e.g., capacitors 32 and 32′; FETs 34 and 34′, etc.) have to be fabricated twice. In such situations the number of circuit elements can be reduced by using some of the circuity of FIG. 3 in common for simultaneously absorbing both the frequency-dependent and the leakage components of the substrate current. An example of such a reduction of elements is illustrated in the embodiment of FIG. 8, which eliminates capacitors 33′ and 32′, FETs 34′ and 35′ and quasi diode 36′ from the circuit of FIG. 3. In FIG. 8 oscillators 31 and 31′ are both connected to capacitor 32 via OR gate 50, so that substrate charge is removed each time the output of oscillator 31 or oscillator 31′ (or both) rises to $V_{cc}$. As was the case in the embodiment of FIG. 3, it will be apparent that oscillator 31 controls the absorption of the major part of the substrate current when the operating frequency is relatively high and that oscillator 31′ predominates when the operating frequency is relatively low, at which time leakage current becomes particularly important.

Figure 6:
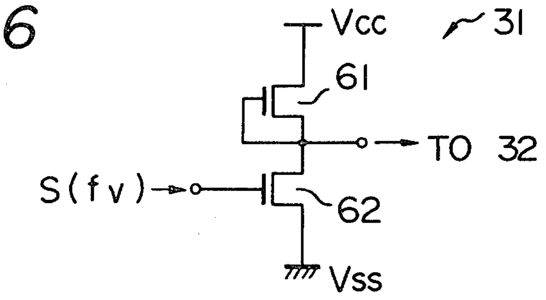
FIG. 6 illustrates one example of an oscillator 31 as shown in FIG. 3.

The operating frequency $f_v$ of the dynamic-type circuit is defined by an external timing clock signal which is usually applied to, for example, the input/output pad 16' shown in FIG. 1. Therefore, in this example, the input of the variable oscillator 31 of FIG. 3 may be connected to the pad 16'. One example of the oscillator 31 is illustrated in FIG. 6. In FIG. 6, the oscillator 31 is comprised of a pair formed by an FET 61 and an FET 62. The FET 61 is connected to the power supply ($V_{cc}$). The FET 62 receives the control signal $S(f_v)$ shown in FIG. 3. The connection between the FETs 61 and 62 leads to the capacitor 32 shown in FIG. 3. The oscillator 31 shown in FIG. 6 may also be deemed a conventional level converter.

Figure 7:
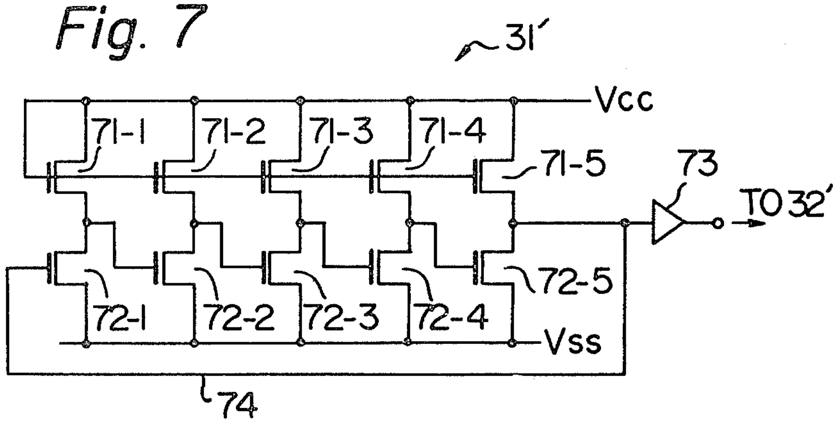
FIG. 7 illustrates one example of an oscillator 31' as shown in FIG. 3.

One example of the oscillator 31' is illustrated in FIG. 7. The oscillator 31' is comprised of a plurality of load FETs 71-1 through 71-5 which are commonly connected at respective gates and the same number of FETs 72-1 through 72-5. The number of pairs of the FETs must be an odd number, for example five as shown in FIG. 7. The output of the last stage (71-5, 72-5) is, on one hand, connected to, via a buffer means 73, the capacitor 32' shown in FIG. 3 and, on the other hand, to the input of the initial stage (71-1, 72-1) via a feedback loop 74. The output of each stage is connected to the input gate of the next stage.

As mentioned above, a semiconductor device which always has an optimum threshold voltage irrespective of the variation of the operating frequency thereof can be realized.

We claim:

1. A semiconductor circuit having a dynamic-type circuit and a bias-voltage generating circuit both mounted on the same substrate, wherein the bias-voltage generating circuit comprises: first means for absorbing from the substrate a first part of a substrate current, the magnitude of said first part of the substrate current being proportional to the operating frequency of the dynamic-type circuit; and second means, functioning simultaneously with said first means, for absorbing from the substrate a second part of the substrate current, said second part of the substrate current corresponding to the junction leak current developed in the substrate.

2. A semiconductor circuit as set forth in claim 1, wherein said first means comprises a first bias-voltage generator and said second means comprises a second bias-voltage generator.

3. A semiconductor circuit as set forth in claim 2, wherein the first bias-voltage generator is comprised of a first oscillator and third means for pumping out the first part of the substrate current under control of the first oscillator, the second bias-voltage generator is comprised of a second oscillator and fourth means for pumping out the second part of the substrate current under control of the second oscillator, the first oscillator producing a first pulse train the frequency of which is proportional to the operating frequency of the dynamic-type circuit, the second oscillator producing a second pulse train having a frequency which is not proportional to the operating frequency of the dynamic-type circuit.

4. A semiconductor circuit as set forth in claim 3, wherein the first oscillator is activated by a timing clock signal which is to be applied to the dynamic-type circuit, while the second oscillator is self-activated.

5. A semiconductor circuit as set forth in claim 3, wherein each of the third and fourth means for pumping out the respective parts of the substrate current is comprised of at least a first capacitor connected to the respective oscillator, a second capacitor having a first end and a second end connected to an external ground point ($V_{ss}$), a quasi diode connecting the first end of the second capacitor and an outlet portion (Ⓑ) through which the substrate current flows, and FET means connected to the first end of the second capacitor and to the external ground point ($V_{ss}$) for repeatedly discharging substrate current previously stored in the first and second capacitors.

6. A semiconductor circuit as set forth in claim 5, wherein another FET is parallely connected to the quasi diode.

7. A semiconductor circuit as set forth in claim 5, wherein the outlet portion is formed on the top surface of the substrate.

8. A circuit as set forth in claim 5, wherein the outlet portion is formed on, at a conductive stage, the bottom surface of the substrate.

9. A semiconductor circuit as set forth in claim 1, wherein the first means comprises a first oscillator producing a first pulse train, the frequency of which is proportional to the operating frequency of the dynamic-type circuit, and wherein the second means comprises a second oscillator producing a second pulse train having a constant frequency which corresponds to the leak current.

10. A semiconductor circuit as set forth in claim 9 wherein the first and second means further comprise third means connected to the first and second oscillators for pumping out substrate current at a rate depending jointly on the frequencies of the first and second pulse trains.

11. A semiconductor circuit as set forth in claim 10, wherein the first oscillator is activated by a timing clock signal which is to be applied to the dynamic-type circuit, while the second oscillator is self-activated.

12. A semiconductor circuit as set forth in claim 10, wherein the third means comprises an OR gate having inputs connected to the first and second oscillators, a first capacitor connected to the output of the OR gate, a second capacitor having a first end and a second end which is connected to an external ground point ($V_{ss}$), a quasi diode connected between the first end of the second capacitor and an outlet portion ( B ) through which the substrate current flows, and FET means connected to the first end of the second capacitor and to the external ground point ($V_{ss}$) for repeatedly discharging substrate current previously stored in the first and second capacitors.

13. A semiconductor circuit as set forth in claim 12, wherein another FET is parallelly connected to the quasi diode.

14. A semiconductor circuit as set forth in claim 12, wherein the outlet portion is formed on the top surface of the substrate.

15. A semiconductor circuit as set forth in claim 12, wherein the outlet portion is formed on, at a conductive state, the bottom surface of the substrate.

* * * * *

UNITED STATES PATENT AND TRADEMARK OFFICE
CERTIFICATE OF CORRECTION

PATENT NO. : 4,430,581

DATED : February 7, 1984

INVENTOR(S) : Mogi et al.

It is certified that error appears in the above-identified patent and that said Letters Patent is hereby corrected as shown below:

| | | |
|---|---|---|
| Column 3, | line 6, | "FIG. 8" begins a new paragraph; |
| | line 66, | "inevitable" should be --inevitably--. |
| Column 6, | line 39, | "vias" should be --bias--. |
| Column 8, | line 48, | "(B)" should be --(Ⓑ)--. |

Signed and Sealed this

*Twelfth* Day of *June 1984*

[SEAL]

*Attest:*

GERALD J. MOSSINGHOFF

*Attesting Officer* *Commissioner of Patents and Trademarks*